United States Patent [19]

Buehler

[11] Patent Number: 4,516,071
[45] Date of Patent: May 7, 1985

[54] SPLIT-CROSS-BRIDGE RESISTOR FOR TESTING FOR PROPER FABRICATION OF INTEGRATED CIRCUITS

[75] Inventor: Martin G. Buehler, La Canada, Calif.

[73] Assignee: The United States of America as represented by the Administration of the United States National Aeronautics and Space Administration, Washington, D.C.

[21] Appl. No.: 402,205

[22] Filed: Jul. 26, 1982

[51] Int. Cl.³ .................... G01R 31/00; G01R 27/02
[52] U.S. Cl. ............................ 324/158 R; 324/65 R
[58] Field of Search ................. 324/158 R, 64, 65 R; 29/574, 578; 430/30

[56] References Cited

U.S. PATENT DOCUMENTS 4,347,479 8/1982 Cullet .............................. 324/158 R

OTHER PUBLICATIONS

Hall, Resistance Calculations for Thin Film Patterns, Thin Solid Film, vol. 1, at 277–295, (1967–1968).
Van der Pauw, a Method of Measuring Specific Resistivity and Hall Effect of Discs of Arbitrary shape, Philips Res. Repts., vol. 13, No. 1, at 1–9, (Feb. 1958).
Von der Pauw, A Method of Measuring the Resistivity and Hall Coeficient on Lamellae of Arbitrary Shape, Philips Technical Review, vol. 20 at 220–224.
Buehler, Comprehensive Test Patterns with Modular Test Structures, the 2 by N Probe-Pad Array Approach, Solid State Technology, Oct. 1979, at 89–94.
Buehler, Grant, Thurber, Bridge and Van der Pauw, Sheet Resistors for Characterizing the Line Width of Conducting Layers, J. Electroclem Soc., vol. 125, No. 4, at 650–654, (1978).
David and Buehler, A Numerical Analysis of Various Cross Sheet Resistor Test Structures, Solid State Electronics., vol. 20, pp. 539–543, (1977).

Primary Examiner—Ernest F. Karlsen
Attorney, Agent, or Firm—Paul F. McCaul; John R. Manning; Thomas H. Jones

[57] ABSTRACT

An electrical testing structure and method whereby a test structure is fabricated on, e.g., a large scale integrated circuit wafer along with the circuit components and has a van der Pauw cross resistor in conjunction with a bridge resistor and a split bridge resistor, the latter having two channels each a line width wide, corresponding to the line width of the wafer circuit components, and with the two channels separated by a space equal to the line spacing of the wafer circuit components. The testing structure has associated voltage and current contact pads arranged in a two by four array for conveniently passing currents through the test structure and measuring voltages at appropriate points to calculate the sheet resistance, line width, line spacing, and line pitch of the circuit components on the wafer electrically.

10 Claims, 9 Drawing Figures

SPLIT-CROSS-BRIDGE RESISTOR FOR TESTING FOR PROPER FABRICATION OF INTEGRATED CIRCUITS

BACKGROUND OF THE INVENTION

1. Field of the Invention

The present invention relates to the testing of the proper fabrication of circuit components of integrated circuits with an electrical testing technique employed with a testing structure fabricated on the integrated circuit along with the fabrication of the remainder of the integrated circuit.

2. Background of the Invention

As the circuit density increases in integrated circuit fabrication, in order to attain, e.g., Very Large Scale Integration, the widths and spacings of conductors are becoming much smaller. Efficient utilization of the integrated circuit chip's "real estate" requires that both line width and spacing be the minimum possible, under the constraints of conductivity and voltage gradient requirements for efficient operation and long life and reliability. Line widths and spacings are rapidly declining into the range of a few micrometers. As they approach the orders of magnitude of the wave length of illuminating light beams used in photo processing currently employed in chip fabrication, the precision of the process tends to decline. This decline of precision becomes especially critical as the tolerances required grow smaller. This aspect of integrated circuit chip fabrication thus becomes one of the more important factors governing both design and fabrication. Measurement of conductor characteristics as actually fabricated becomes imperative. The advances in maximizing use of the chip "real estate" have made it impossible in many cases to rely solely on the precision of the photomask geometry used in fabricating the chip as is known in the art.

One approach to verifying the accuracy of the chip component sizes as fabricated is optical analysis known in the art. This requires at least several minutes of visual measurement by comparator techniques, and is not readily adaptable to automation or to high-speed production techniques. To partially overcome these drawbacks, it has previously been suggested by the applicant with others to use an electrical measuring technique employing a cross-bridge resistor, i.e., one having a van der Pauw resistor and a bridge resistor. See, Buehler, M. G., Grant, S. D., and Thurber, W. R., "Bridge and van der Pauw Sheet Resistors for Characterizing the Line Width of Conducting Layers," *J. Electrochem. Soc.*, Vol. 125, No. 4 (April 1978), pp. 650–54, the disclosure of which is hereby incorporated by reference. This technique employed a pattern, e.g., in the form of a cross and bridge, with six larger probe pads connected to appropriate points of the structure, which was fabricated on the wafer along with other circuits as a test sample. Since this was processed along with the remainder of the circuits on the wafer, it was an accurate sample of the actual circuit conductors. By applying currents and measuring voltages to probe pads arranged in a 2 by 3 configuration, the line width and the sheet resistance of the cross-bridge resistor could be determined. The measurement was fast, and the determination of actual values from the results could be instantly accomplished by, e.g., a microprocessor or computer. Thus the cross-bridge resistor was amenable to high-speed automation techniques. However, it had at least one serious drawback in that line spacing could not be determined. Thus optical techniques were still required.

The problems enumerated in the foregoing are not intended to be exhaustive, but rather are among many which tend to impair the effectiveness of prior art techniques and apparatus for testing the fabrication of large-scale integrated circuit components. Other noteworthy problems may also exist; however, those presented above should be sufficient to demonstrate that such techniques and apparatus have not been entirely satisfactory. It is therefore a general objective of the present invention to provide an improved method and apparatus for determining the proper fabrication of components of large-scale integrated circuit chips.

3. Summary of the Invention

By fabricating a special conductor pattern on an integrated circuit, combining a van der Pauw type cross resistor, a bridge resistor, and longitudinally split-bridge resistor accessed by eight probe pads, line spacing, line width, line pitch and sheet resistance can be measured in about one second. The line pitch determination gives the measurement a self-checking capability. Thus fabrication processes can be evaluated and verified directly and quickly, as can adherence to geometrical layout rules.

A pair of conductors has been added to an extension of the cross-bridge resistor, in accordance with the present invention, with appropriate probe pads, to form a bridge resistor configuration, with the cross-bridge resistor being extended to form a longitudinally-split-bridge resistor. Each element of the split conductor is one line width wide, and they are separated by a space equalling the space width of the integrated circuit components. It is not essential that both conductors be equal. What is required is that the sum of the width of both conductors be two line widths wide. This means that the spacing feature need not be perfectly centered laterally in the split-bridge resistor. The cross and bridge resistors are preferably as wide as the sum of the three elements of the split conductor, although the cross resistor could be any size or shape of a van der Pauw construction. By use of the proper probe voltages and equations, complete measurements can be accomplished in about one second.

The present invention can be used with various integrated circuits fabricated in any of a number of ways well known in the art, e.g., deposited metal; polycrystalline silicon layers; or junction isolated diffused layers. In addition, it could be used, e.g., with printed circuit boards and with thick and thin film hybrid substrates, wherein etched metal line widths and spacing are of importance.

By calculating the line pitch, that is, the basic modular spacing of one line plus one space, in accordance with the present invention, the apparatus and method of the present invention is self-checking. If the measurements and calculations are properly made, the sum of the calculated line width and spacing must equal the designed line pitch.

With the application of the eight probes simultaneously in a 2 by 4 probe pad array in accordance with the present invention, the measurements and the calculations can be performed in about one second. These measurements are easily correlated with optical measurements, and with the photomask geometry. Thus the present invention can be used as a check on processing, for quality control in production, and for vendor evaluation. The design criteria for the structure of the present invention are explained in further detail below.

Examples of the more important features of the present invention have been summarized rather broadly in order that the detailed description thereof which follows can be better understood and the improvement in the art better appreciated. There are, of course, additional features of the present invention that will be described herein and which will form the subject of the appended claims. These other features and advantages of the present invention will become apparent from the detailed description thereof in connection with the accompanying drawings, wherein like reference numerals have been applied to like elements, and in which:

DETAILED DESCRIPTION OF THE PREFERRED EMBODIMENTS OF THE INVENTION

Figure 1:
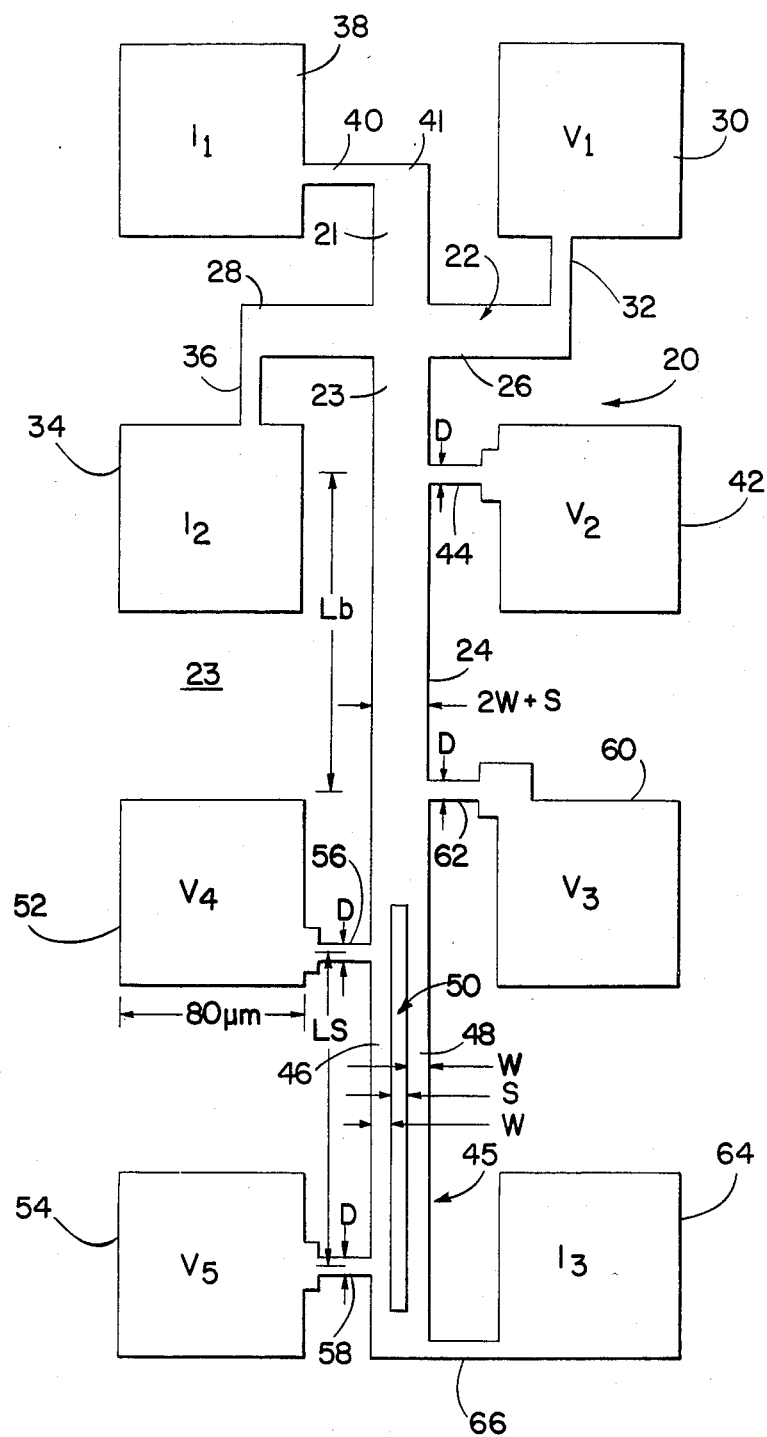
FIG. 1 shows a split-cross-bridge resistor in accordance with the present invention for evaluating, e.g., the line width, line spacing, line pitch and sheet resistance of a metal layer fabricated on an integrated circuit chip.

Turning now to FIG. 1, a test structure 20 is shown to contain a cross resistor 22, which is formed of a metal layer etched on the surface 23 of the integrated circuit chip at the same time as the remainder of the chip components are fabricated on the surface 23. The cross resistor 22 has resistance arm layers 21, 23, 26, 28 extending on either side of the resistance layer 21. A voltage contact pad 30 is electrically connected by a conductor layer 32 to the terminal end of the arm 26. A current contact pad 34 is electrically connected by a conductor layer 36 to the terminal end of the arm 28. A current contact pad 38 is electrically connected by a conductor layer 40 to one end 41 of the resistance layer 21 and a voltage contact pad 42 is electrically connected by a conductor layer 44 to the other end of the resistance layer 23 forming the cross-resistor 22.

A bridge resistor layer 24 is connected between the cross resistor 22 and a split-bridge resistor 45, formed by a first channel conductor layer 46 and a second channel conductor layer 48 separated by a nonconducting space 50. The sum of the widths W of the two-channel conductor layers 46, 48 and the width S of the space 50 is equal to the width of the bridge resistor 24. The lengths of each of the split-bridge resistor 45 channel conductor layers 46, 48 are equal.

A first voltage contact pad 52 and a second voltage contact pad 54 are each respectively electrically connected to the channel conductor layer 46 by electrical conductor layers 56 and 58. A third voltage contact 42 and a fourth voltage contact 60 are each respectively electrically connected to the bridge resistor 24 by electrical conductor layers 44 and 62. A current contact pad 64 is electrically connected to the terminal end of the split-bridge resistor 45 by an electrical conductor layer 66.

Figure 2:
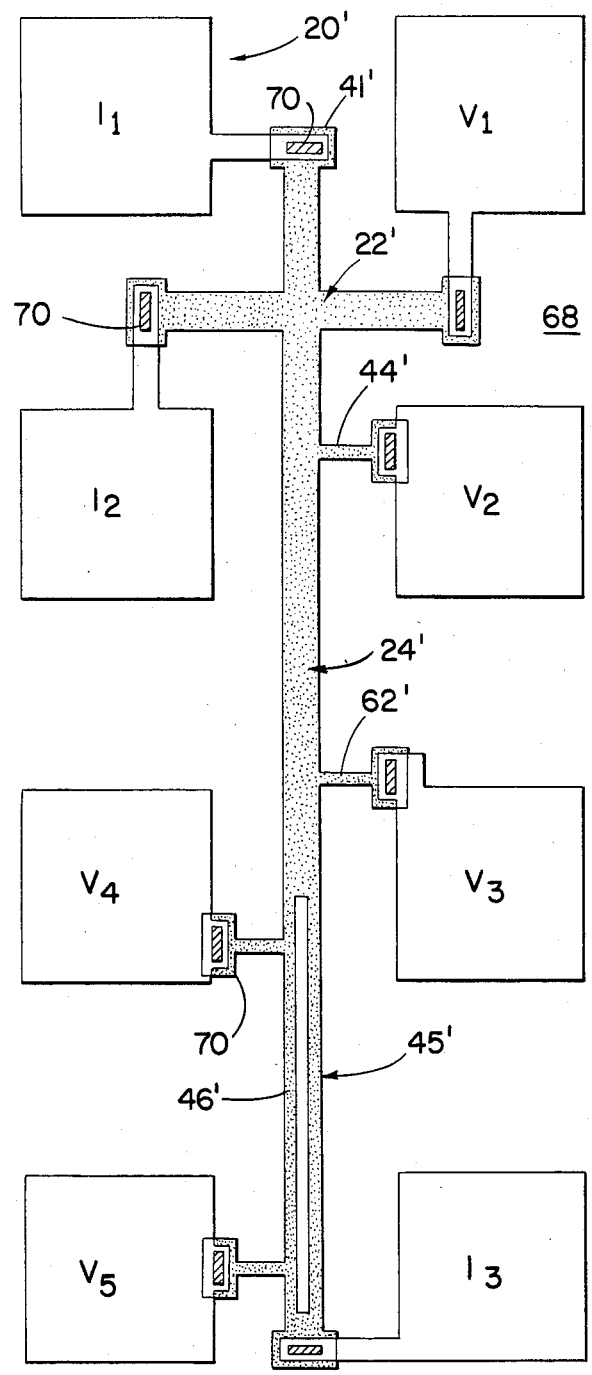
FIG. 2 shows a split-cross-bridge resistor in accordance with the present invention for evaluating, e.g., the line width, line spacing, line pitch and sheet resistance of an integrated circuit chip fabricated, e.g., by either a polycrystalline silicon layer fabrication technique or a junction isolated diffused layer fabrication technique. In the latter, the layout rule line width and line spacing differ from the measured effective values due to the lateral diffusion and oxidation steps.

Shown in FIG. 2 is a similar test structure 20' to that of FIG. 1 which has been fabricated in a chip having, e.g., diffused or polycrystalline silicon component layers. The cross resistor, bridge resistor, and split-bridge resistor portions 22', 24' and 45' are fabricated on the chip surface 68 in like manner and of the same layer construction as the chip components, e.g., diffusion layers or polycrystalline silicon layers. The voltage and current contact pads remain fabricated of metal on the chip surface 68 as in FIG. 1 and have contact areas 70 which electrically connect the contact pads to the conductors of the test structure 20' as it is fabricated on the chip surface 68. The contact areas are formed as is well known in the art by etching out small openings in the appropriate places in an oxide layer (not shown in FIG. 2) covering the diffusion or silicon layer 22', 24', 45', prior to applying a metal layer to be etched to form the current and voltage contact pads.

Turning again to FIG. 1, a new test structure 20 is shown according to the present invention for evaluating the line spacing, line width, line pitch and sheet resistance of conductors on the same layer in an integrated circuit chip using an electrical measurement technique. This test structure 20 is capable of use, as is shown by FIG. 1 along with FIG. 2 to evaluate such conducting layers as diffused, polycrystalline silicon, or metal layers found in the manufacture of integrated circuits.

To illustrate the measurement principle of the present invention shown in FIGS. 1 and 2, e.g., the metal layer, split-cross-bridge resistor 20 as shown in FIG. 1 will be used. It is capable of evaluating, e.g., the line width and the line spacing between two metal line layers on the integrated circuit chip 23. The split-cross-bridge resistor 20 is a combination of three structures. The upper cross-structure 22 is a cross-resistor which is of a suitable van der Pauw construction. The middle structure is a bridge resistor 24 and the lower structure is a split-bridge resistor 45. The bridge resistor 24 has a channel width of 2W+S, and the split-bridge resistor 45 has two channels 46, 48, each with a width of W where W is the layout rule line width for the integrated circuit components and S is the layout rule line spacing for the integrated circuit components. The line spacing, S, is determined by subtracting the total width of the channels 46, 48 ($W_s=2W$) from the width of, e.g., the bridge resistor 24 ($W_b=2W+S$). It is not required that W and S be the layout rule minimum values. They can be any value above the minimum, e.g., if it is desired to check, e.g., line width or spacing which on the integrated circuit are larger than the layout rule minimum.

The measurement technique of the present invention requires three electrical measurements, which are illustrated by the following idealized relationships. These relationships are uncorrected for geometrical errors, which, as discussed below, can be ignored if the structure according to the present invention is constructed properly. In the analysis, the sheet resistance, $R_s$, of the layers is used, and is calculated from the cross resistor 22 using the van der Pauw equation as shown in L. J. van der Pauw, *Philips Res. Rep.*, Vol. 13, p. 1 (1958) and *Philips Tech. Rev.*, Vol. 20, p. 220 (1958):

$$R_s=(V_c/I_c)(\pi/\ln 2) \qquad (1)$$

where the potential difference, $V_c$, is the voltage at the contact pad 30 less the voltage at the contact pad 42 for a current, $I_c$, passed into the contact pad 38 and out of the contact pad 34.

The width of the bridge resistor 24 illustrated in FIGS. 1 and 2 is determined from the rectangular resistor equation:

$$W_b=2W+S=R_sL_bI_b/V_b \qquad (2)$$

where the potential difference, $V_b$, is the voltage at the contact pad 42 less the voltage at the contact pad 60 for a current, $I_b$, passed into the current contact pad 38 and out of the current contact pad 64. The distance between the voltage taps 44 and 62 is $L_b$, which is the distance specified on the photomask. The sheet resistance $R_s$ follows from the cross resistor; i.e., Eq (1). The width of the split-bridge resistor is determined from $$W_s=2W=R_sL_sI_s/V_s \qquad (3)$$

where the potential difference, $V_s$ is the voltage at the voltage contact pad 52 less the voltage at the voltage contact pad 54 for a current, $I_s$, passed into the current contact pad 38 and out of the current contact pad 64. The distance between the electrical conductors 56, 58 of the voltage contact pads 52 and 54 is $L_s$. The sheet resistance $R_s$ follows from the cross resistor; i.e., Eq (1).

Line spacing is calculated from $$S=W_b-W_s=R_s(L_bI_bV_s-L_sI_sV_b)/(V_bV_s). \qquad (4)$$

For $I_b=I_s=I$ and $L_b=L_s=L$, then $$S=R_sLI(V_s-V_b)/(V_bV_s). \qquad (5)$$

The line width is calculated by modifying Eq (3), assuming $I_s=I$ and $L_s=L$:

$$W=R_sLI/(2V_s). \qquad (6)$$

Finally, line pitch is determined from $$W+S=W_b-(W_s/2)=R_sLI(2V_s-V_b)/(2V_bV_s). \qquad (7)$$

Thus the split-cross-bridge resistor 20 can be used to evaluate four critical parameters of a conducting layer; i.e., sheet resistance, line width, line spacing, and line pitch.

Figure 3:
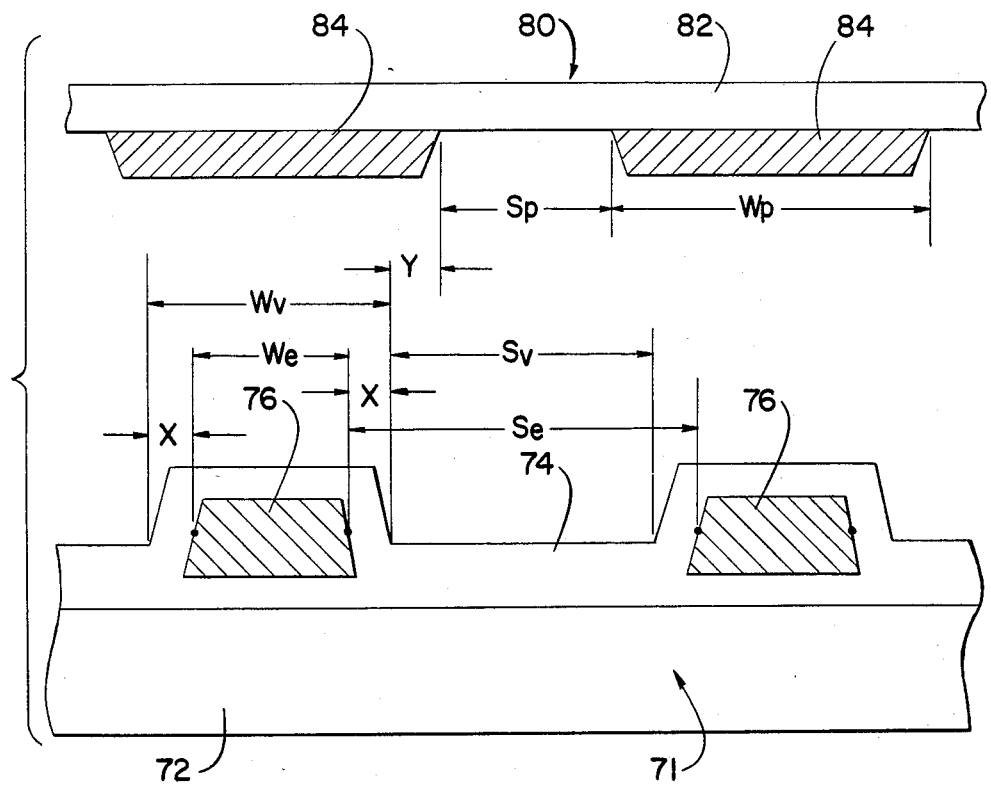
FIG. 3 is a cross-sectional view of a polycrystalline silicon layer and a photomask used for the construction of the chip as is known in the art, and with an indication of the dimensions capable of being measured and employed in the measurements in accordance with the present invention.
Figure 4A:
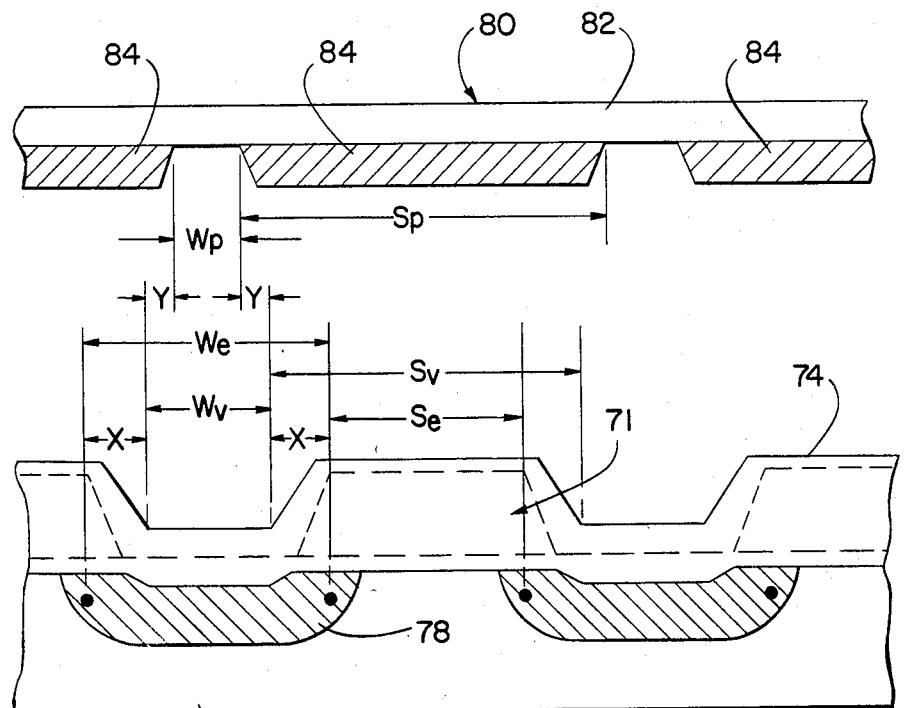
FIG. 4a is a cross-sectional view of a diffused layer fabrication formed by a uniform oxidation, diffusion, oxidation process, and with an indication of dimensions useful in the measurements and capable of being measured in accordance with the present invention.
Figure 4B:
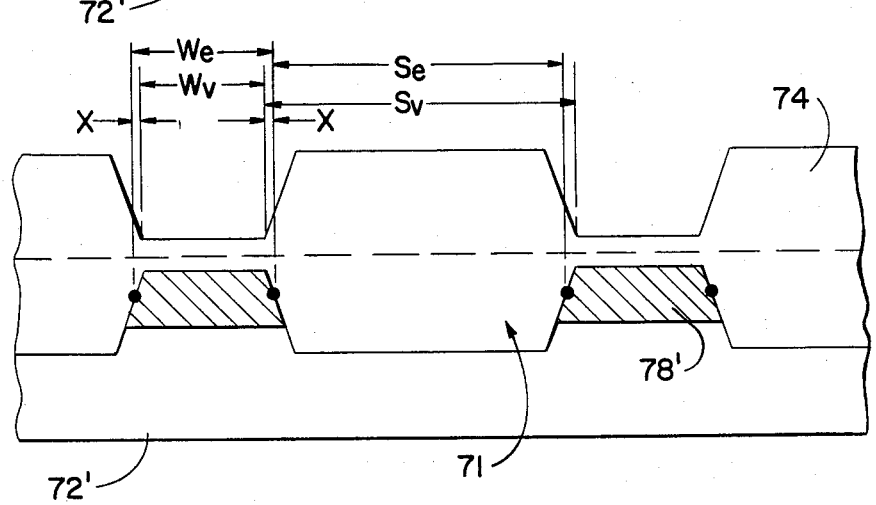
FIG. 4b is a cross-sectional view of a diffused layer fabrication formed by a local oxidation, diffusion, oxidation process, and with an indication of the dimensions useful in the measurements and capable of being measured in accordance with the present invention.

The present invention enables comparing the line widths and spacings of features found on photomasks used in fabricating integrated circuit chips and wafers, as measured by either the usual visual techniques or the electrical technique according to the present invention. As the fabrication process proceeds, feature sizes can expand or contract due to lateral etching, lateral diffusion, and the coating of features as is known in the art. The present invention uses the following eight parameters:

$W_p$, $S_p$=respectively, the line width and spacing of a feature observed visually on a photomask 80, as shown in FIGS. 3 and 4*a* and *b* having a glass substrate 82 and emulsion regions 84.

$W_v$, $S_v$=respectively, the line width and spacing of a feature observed visually on a fabricated wafer 71 as shown in FIGS. 3 and 4*a* and *b*.

$W_e$, $S_e$=respectively, the line width and spacing of a layer 76 shown in FIG. 3 or 78 or 78' shown in, respectively, FIGS. 4*a* and *b*, measured electrically on a fabricated wafer 71.

Y=the difference in the location of a feature edge, as determined from visual measurements, made on photomasks 80 and fabricated wafers 71.

X=the difference in the location of a feature edge, as determined from visual and electical measurements on fabricated wafers 71.

The relation among these parameters is shown in FIGS. 3 and 4*a* and *b*. FIG. 3 illustrates the fabrication of a polycrystalline silicon (poly) layer 76 where the width of the poly layer 76 is smaller than the feature as defined by the emulsion region 84 on the photomask 80. The visual width $W_v$ is arbitrarily shown at the base of the oxide layer 74, which surrounds the poly layer 76. The electrical width $W_e$ is shown at the midpoint in the length of the trapezoid describing the poly layer 76 in cross-section. FIG. 4*a* illustrates the formation of a diffused layer 78 by a uniform-oxidation, diffusion, oxidation process. As illustrated in FIG. 4*a*, the electrical width, $W_e$, includes not only the planar portion of the diffusion but a fraction of the lateral diffusion region as well.

The mathematical relationship among the eight parameters are shown in Table I. The measured quantities $W_b$ and $W_s$ are shown, along with three derived quantities $W_b-W_s$ (line spacing), $W_s/2$ (line width), and $W_b-W_s/2$ (line pitch). As can be seen in Table I, $W_e$ and $S_e$ are larger or smaller than $W_v$ and $S_v$ or $W_p$ and $S_p$ depending on the nature of the layer being formed. For example, for a diffused layer, $W_e$ is larger than $W_p$ by $2Y+2X$, and $S_e$ is smaller than $S_p$ by $2Y+2X$. Such discrepancies are significant in manufacturing processes.

TABLE I

| | Comparison of Line widths and Spacings | | |
|---|---|---|---|
| MEASURED/DERIVED | ELECTRICAL | VISUAL | PHOTOMASK |
| METAL/POLY | | | |
| $W_b$ | $= 2W_e + S_e$ | $= 2W_v + S_v - 2X$ | $= 2W_p + S_p - 2Y - 2X$ |
| $W_s$ | $= 2W_e$ | $= 2(W_v - 2X)$ | $= 2(W_p - 2Y - 2X)$ |
| $W_b - W_s$ | $= S_e$ | $= S_v + 2X$ | $= S_p + 2Y + 2X$ |
| $W_s/2$ | $= W_e$ | $= W_v - 2X$ | $= W_p - 2Y - 2X$ |
| $W_b - (W_s/2)$ | $= W_e + S_e$ | $= W_v + S_v$ | $= W_p + S_p$ |
| DIFFUSION | | | |
| $W_b$ | $= 2W_e + S_e$ | $= 2W_v + S_v + 2X$ | $= 2W_p + S_p + 2Y + 2X$ |
| $W_s$ | $= W_e$ | $= 2(W_v + 2X)$ | $= 2(W_p + 2Y + 2X)$ |
| $W_b - W_s$ | $= S_e$ | $= S_v - 2X$ | $= S_p - 2Y - 2X$ |
| $W_s/2$ | $= W_e$ | $= W_v + 2X$ | $= W_p + 2Y + 2X$ |
| $W_b - (W_s/2)$ | $= W_e + S_e$ | $= W_v + S_v$ | $= W_p + S_p$ |

The line pitch, $W_b-(W_s/2)$, as can be seen from Table I, i.e., $W_e+S_e = W_p+S_p$, is a direct measure of the features formed on the photomask 80. That is, $W_e+S_e$ are not affected by Y and X because they are distances between features that have the same kind of edge. For example, $W_e+S_e$ is the distance between the left edges of two parallel lines on the adjacent poly trapezoids 76 shown in FIG. 3. This distance is not affected by linear changes in the photomask 80 features (bloating and shrinking) or by the wafer 71 fabrication processes, because both edges are affected in an identical fashion, provided the features are not magnified. If magnification can be ruled out, then $W_e+S_e$ can be used to verify that the desired layout rules for the integrated circuit chip 71 were fabricated correctly on the photomasks 80.

The voltage and current contact pads 30, 34, 38, 42, 52, 54, 60 and 64 of the split cross-bridge resistor 20 are disposed so that they can be probed with a 2 by N probe array where N is an arbitrary positive, integer, for example, as described in M. G. Buehler, "Comprehensive Test Patterns with Modular Test Structures: The 2 by N Probe-Pad Array Approach," *Solid State Technology*, pp. 89–94 (October 1979), the disclosure of which is incorporated herein by reference. As illustrated in FIGS. 1 and 2, N=4, and the probe pads 30, 34, 38, 42, 52, 54, 60 and 64 are 80-micrometer squares separated by 80 micrometers. The distances $L_b$ and $L_c$ are the same length (135 micrometers) so that they can be easily verified using visual inspection techniques.

Figure 5:
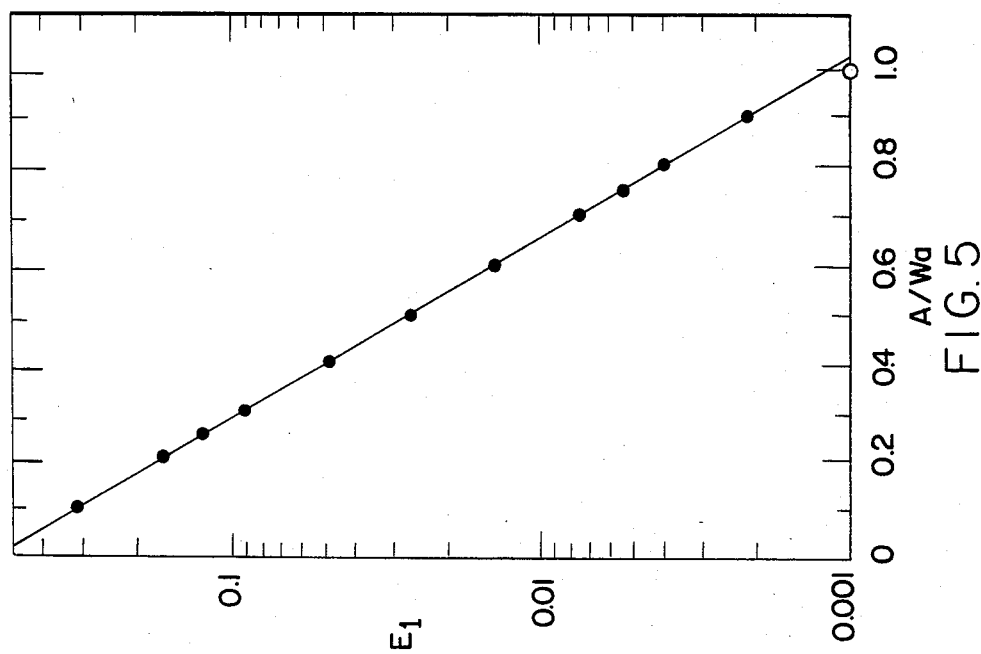
FIG. 5 is a graphical illustration of a means for reducing error in measuring sheet resistance by use of a cross resistor, through proper selection of the ratio of arm length to arm width, in accordance with the teachings employed in the present invention.

The cross-resistor 22 and 22' as shown in FIGS. 1 and 2 is constructed from two equal width rectangles that intersect at right angles, one formed by the resistance arms 21 and 23 and the other by the arms 26 and 28. The length of each arm 21, 23, 26 and 28 of the cross should be at least twice the arm 21, 23, 26 and 28 width for the sheet resistance to be calculated accurately from the idealized expression of Eq (1). This design rule follows from a detailed analysis of this cross-resistor structure, which is shown in FIG. 5 and described in more detail in David, J. M. and Buehler, M. G., "A Numerical Analysis of Various Cross Sheet Resistor Test Structures,"*Solid-State Electronics*, Vol. 20, 539–43 (1977). It will be understood, however, that the cross resistor 22 or 22' could be of any of a variety of shapes which comport with the van der Pauw characteristics. The $R_s$ as calculated from Eq (1) is slightly less than the true sheet resistance, $R_{st}$, as given by $$R_s = R_{st}(1-E_1) \tag{8}$$

where $E_1$ is the error. As shown in FIG. 5 when $A \geq 2W_a$, where A is the length of the arm, e.g., 21, 23, 26 or 28 and $W_a$ the width, the error is negligible.

The split-bridge resistor 45 or 45' is constructed from a pair of conducting channels 46 and 48, one of which, e.g., 46 is tapped in two places along its length. Of importance to the structure of the present invention are the distance between and width of the voltage taps 56 and 58, the length of the voltage taps 56 and 58, and the location of the respective taps 56 and 58 relative to a change in the channel 46 width at the juncture of the bridge resistor layer 24 or 24' and the split-bridge resistor 45 or 45', and also at the terminal end of the split-bridge resistor 45 or 45' to which conductor 66 is electrically connected.

Figure 6:
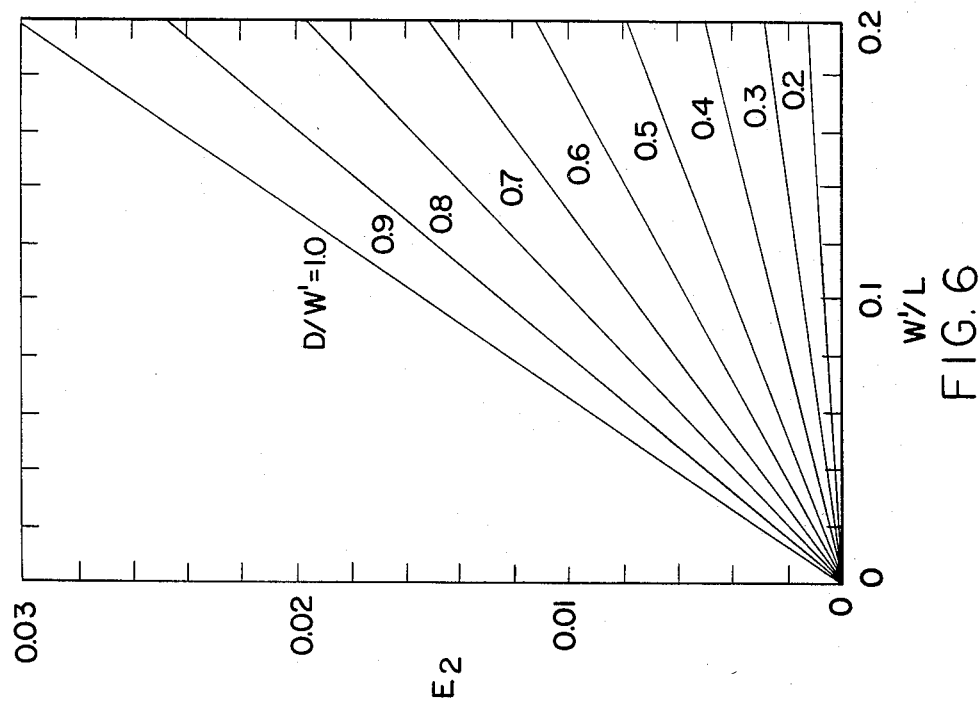
FIG. 6 shows a graphical representation of a means for reducing error in measuring line width introduced by the bridge resistor structure in accordance with the present invention due to perturbations in the channel current flow caused by the presence of voltage tap conductors.

The distance between and width of the taps 56 and 58, which must be maintained for the line width to be calculated accurately from the idealized expression for the line width is determined from the results of an analysis of the bridge resistor as presented in FIG. 6.

This result is based upon the work of P. M. Hall, "Resistance Calculations for Thin Film Patterns," *Thin Solid Films*, Vol. 1, pp. 277–295 (1967–68). Equation 48 therein indicates that the resistance between the taps of a bridge resistor 24 or 24', 46 or 46' is given by $$R = R_{st}(L/W')(1-E_2) \tag{9}$$

where the error $E_2$ is $$E_2 = (2W'/L)[(D/W') \tan^{-1}(D/2W') - \ln((D^2/4W'^2)+1)] \tag{10a}$$

and the idealized width is $$W' = (R_{st}/R)L \tag{10b}$$

and L is the distance between the taps 44 and 62 ($L_b$) or 56 and 58 ($L_s$), W' is the width of the conducting channel 24 (2W+S) or 46 (W), and D is the width of the tap 44, 62, 56 or 58. From this expression, the idealized width is expressed as:

$$W' = W_t/(1-E_2). \tag{11}$$

This indicates that W', as calculated from Eq (10b) is slightly larger than the true width, $W_t$.

The distance between the voltage taps 56, 58 and 44, 62 was chosen to reduce the error $E_2$ to an acceptable amount. In the structure according to the present invention an L=135 micrometers is used for both $L_b$ and $L_s$. The width D of the taps 44, 62, 56, and 58 is taken at the layout rule limit to minimize errors. The layout rule value for the line widths of the various layers is listed in Table II along with the geometrical errors. Where the structure of the split-cross-bridge resistor 20 is fabricated in a metal layer the error is the worst case. But even in this worst case the error is seen to be less than one percent.

TABLE II

Split-Cross-Bridge Resistor
Layout Rules and Geometrical Errors

| Layer | W Line width (micrometers) | S Line Spacing (micrometers) | $\frac{W_b}{L_b}$ | $\frac{D}{W_b}$ | $E_{2b}$ | $\frac{W}{L_s}$ | $\frac{D}{W}$ | $E_{2s}$ |
|---|---|---|---|---|---|---|---|---|
| Metal | 7.5 | 7.5 | 0.167 | 0.333 | 0.003 | 0.055 | 1.0 | 0.0084 |
| Polycrystalline Silicon | 5.0 | 5.0 | 0.111 | 0.333 | 0.002 | 0.037 | 1.0 | 0.006 |
| Diffusion (Thin Oxide) | 5.0 | 7.5 | 0.130 | 0.286 | 0.002 | 0.037 | 1.0 | 0.006 |

$L_b = L_s = 135$ micrometers

Figure 7:
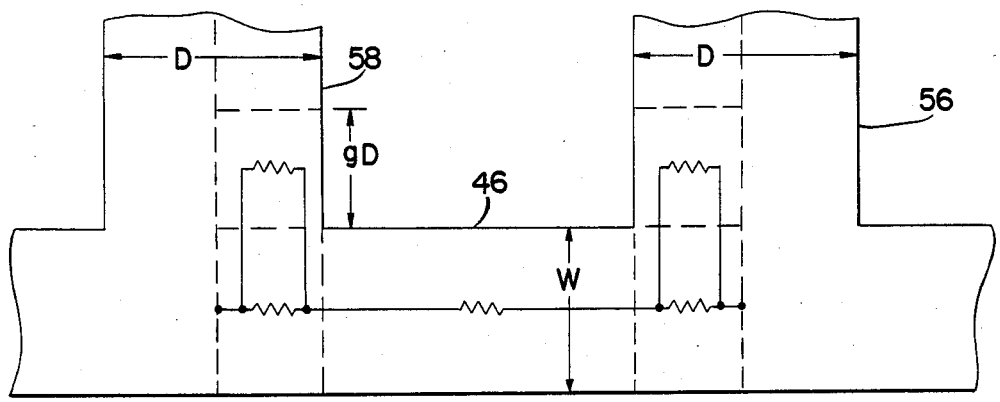
FIG. 7 shows a voltage tap model including a resistor model of a portion of the bridge resistor structure used with the graph of FIG. 6 and in estimating the region of the tap which handles significant current for purposes of designing the structure of the present invention.

The length of the voltage taps 56, 58, or 44, 62, from the respective channel 46 or 24 to the respective contact pad 52, 54 and 42, 60, should be at least twice the width of the taps 58, 56 or 44, 62 for the line width to be calculated accurately from idealized expression for the line width, Eq (6). This rule follows from a resistor model developed for the bridge as shown in FIG. 7. Each major area of, e.g., the resistor 46 and taps 56, 58 is assigned an equivalent resistance that is calculated from the rectangular resistor equation. The objective of the model is to determine the parameter "g", which indicates how much of each of the taps 56, 58 is effective in carrying current. The model reveals that $$R = V/I = R_{st}[(L/W) - E_3] \quad (12)$$

where $$E_3 = (D/W)/[1 + (W/gD)]. \quad (13)$$

The parameter "g" was evaluated by finding a value for g that provides a good fit between a plot of $E_3$ versus D/W and an analytical expression derived from Hall's Eq. (48):

$$E_4 = (L/W)E_2 = (2/\pi)[(D/W) \tan^{-1}(D/2W) - \ln((D^2/4W^2) + 1)]. \quad (14)$$

This equation was derived from conformal mapping theory and describes the resistance in the region of the taps 56, 58. The result is g=0.18. This result indicates that only a small fraction of each of the taps 56, 58 serves to shunt current from the main channel. The design rule requires that the length of taps 56, 58 be greater than twice the tap width. For this case the length of the taps 56, 58 relative to the tap width is 11.1 times longer than g, which should minimize errors due to terminating the taps 56, 58. The same analysis would apply as to the bridge resistance on 24 or 24' and the taps 44 and 62, where the value for W in the above Eqs (12)-(14) is 2W+S.

Figure 8:
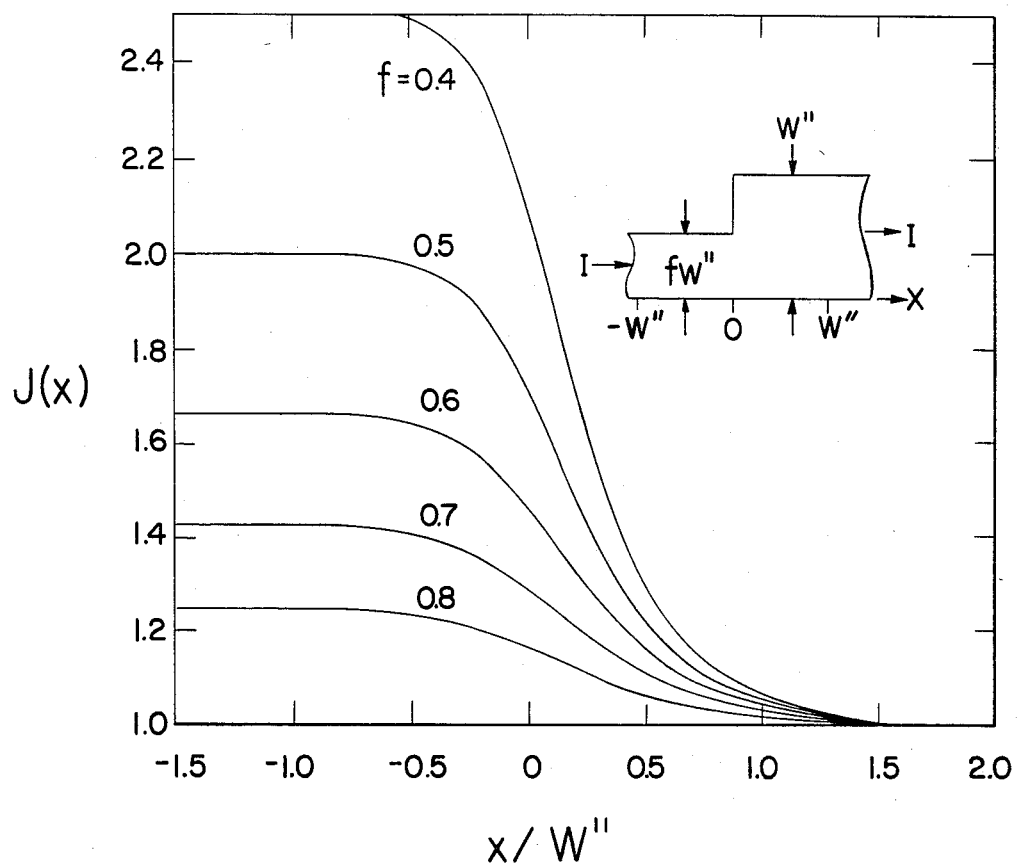
FIG. 8 shows a graph used for evaluating current density along the bottom edge of a conducting layer that abruptly changes in width, for purposes of designing the structure of the present invention.

The edge of the taps 56, 58 should be located twice the channel 46 width from a change in the channel 46 width in order for the line width to be calculated accurately, from the expression for the idealized line width. This follows from an analysis of current flow past a discontinuity in the width of the channel 46 as shown in FIG. 8. What is depicted in the diagram in the upper right of FIG. 8 is channel 46 with a width denoted as fW'' and one-half of the bridge resistor 24, having a width denoted as W'''. The analytical expressions for the current density J(x) along the longitudinal x-axis are $$J(x) = (1 + t)^{\frac{1}{2}}/(1 + f^2 t)^{\frac{1}{2}} \quad (15)$$

where f is the ratio of the smaller channel to the larger channel and t is a parameter as defined below in equation 17. The distance along the x-axis is $$x = \pi^{-1}\left[ \ln\left(\frac{(1 + t)^{\frac{1}{2}} + (1 + f^2 t)^{\frac{1}{2}}}{(1 + t)^{\frac{1}{2}} - (1 + f^2 t)^{\frac{1}{2}}}\right) - f\ln\left(\frac{(1 + f^2 t)^{\frac{1}{2}} + f(1 + t)^{\frac{1}{2}}}{(1 + f^2 t)^{\frac{1}{2}} - f(1 + t)^{\frac{1}{2}}}\right) \right] \quad (16)$$

where $$t = \exp(-2v). \quad (17)$$

These expressions were derived from Hall's Eqs (40) and (41) using the transformation $2\tanh^{-1}z = \ln[(1+z)/(1-z)]$, where z is an arbitrary parameter.

The results shown in FIG. 8 indicate that the current density settles out in a distance from the channel 46 discontinuity that is less than twice the channel 46 width. Thus, e.g., tap 56 is placed at a distance of at least twice the width of channel 46 from the discontinuity in width between the bridge resistor 24 and channel 46. Similarly, e.g., tap 62 is placed at a distance at least twice the width of the bridge resistor 24 from the discontinuity in width between the bridge resistor 24 and the split-bridge resistor 45 channels 46 and 48.

Measurement procedures for evaluating the sheet resistance and the line width are detailed elsewhere in the Buehler et al. and Hall references noted above and also in M. G. Buehler and W. R. Thurber, "An Experimental Study of Various Cross Sheet Resistor Test Structures," *J. Electrochem. Soc.*, Vol. 125, No. 4, pp. 645–50 (April 1978), the disclosure of which is hereby incorporated by reference. These procedures require the split-bridge resistor 45 or 45' voltage to be measured for current flowing in both directions through the channel 46. This would appear to eliminate errors introduced by voltage offsets due to instrumentation errors and thermal voltages at switch relays. The elimination of this source of error assumes that the current reversal is accurate. Also, the cross-resistor 22 should be measured as described in the above Buehler and Thurber reference.

SUMMARY OF THE ADVANTAGES AND SCOPE OF THE INVENTION

It will be appreciated that in constructing a test structure in accordance with the present invention and fabricating the same on an integrated circuit chip at the same time as the integrated circuit chip components are fabricated, certain significant advantages are provided.

The split-cross-bridge resistor of the present invention is a new and spatially compact approach to measuring the sheet resistance, line width, line spacing and line pitch between various kinds of conducting lines fabricated on integrated circuit chips quickly and accurately using electrical measurement techniques. The necessity for using time consuming optical measuring techniques has been eliminated by the present invention. Measurements made by visual techniques can be related to the electrical measurements of, e.g., line width and spacing. For the line width and spacing measurements, the two techniques give different results due to lateral diffusions and the coating of layers. For "line width+spacing" measurements the visual and electrical techniques measure the same quantity, provided features have not been magnified during the photomask and wafer fabrication processes. If magnification can be ruled out, then the electrical measurement of $W_e + S_e$ can be used to verify that the layout rules were fabricated correctly on the photomasks. The test structures of the present invention enable measuring the sheet resistance, line width, and spacing of metal, poly, and diffused layers. The geometrical errors for the test structure according to the present invention are less than 1 percent, enabling the use of uncorrected idealized equations.

The foregoing description of the present invention has been directed to a particular preferred embodiment in accordance with the requirements of the Patent Statutes and for purposes of explanation and illustration. It will be apparent, however, to those skilled in this art that many modifications and changes in both the apparatus and method of the present invention may be made without departing from the true scope and spirit of the present invention. For example, the layout of the elements of the present invention has been chosen for convenience in fabrication and for compactness of layout. The precise layout need not be as shown in the drawings and, indeed, the bridge resistor need not extend along a longitudinal axis common to the cross-resistor and the split-bridge resistor. It will be further apparent that the invention may also be utilized with suitable modifications within the skill of the art. These modifications will be apparent to those skilled in the art, for example, the present invention could also be used to measure line width and spacing on a printed circuit board or on a hybrid substrate, and integrated circuit as used in the claims is meant also to include these and other equivalent types of circuits where line width and spacing may be important and can be measured electrically as described herein. It is the applicant's intention in the following claims to cover all such equivalent modifications and variations as come within the true spirit and scope of the inventions.

What is claimed is:

1. A testing apparatus for testing the accuracy of fabrication of circuit components on an integrated circuit comprising:
   a cross resistor having a first voltage contact pad and first and second current contact in electrical contact therewith;
   a bridge resistor electrically connected at one and thereof to the cross resistor and having first and second bridge resistor voltage contact pads in electrical contact therewith;
   a split-bridge resistor having first and second split conductor channels electrically connected to the other end of the bridge resistor and having first and second split conductor voltage contact pads electrically connected to the first split conductor channel, with the second split conductor channel spaced apart from the first; and,
   a current contact pad in electrical contact with the junction of the split conductor channels at the end thereof remote from the bridge resistor.

2. The apparatus of claim 1 wherein:
   the cross resistor is formed by first and second intersecting rectangular portions resulting in a central portion with four appending portions, each appending portion having a length at least twice its width.

3. The apparatus of claim 1 wherein:
   the first and second bridge resistor voltage contact pads are each electrically connected to the bridge resistor by a tap conducted having a width and a centerline axis, with the centerline axis of each of the tap conductors spaced apart by a separation distance; and wherein,
   the ratio of the width of each of the tap conductors and the width of the bridge resistor is selected, in conjunction with the ratio of the width of the bridge resistor to the separation distance, to reduce the measurement error below a selected value.

4. The apparatus of claim 3 wherein:
   the first and second bridge resistor voltage contact taps each having a length at least twice their width.

5. The apparatus of claim 2 wherein:
   the first and second bridge resistor voltage contact pads are each electrically connected to the bridge resistor by a tap conductor having a centerline axis; and wherein,
   the centerline axis of the first bridge resistor voltage contact pad tap is spaced apart from the border of the central portion adjacent to the portion of the cross resistor in electrical contact with the bridge resistor and the centerline axis of the second bridge resistor voltage contact pad tap is spaced apart from the junction of the split-bridge resistor and the bridge resistor, by at least a distance equal to twice the width of the bridge resistor.

6. The apparatus of claim 1 wherein:
   the first and second split-bridge resistor voltage contact pads are each electrically connected to the split-bridge resistor by, respectively, a first and a second split-bridge resistor tap conductor each having a width, and with the centerline of each split-bridge resistor tap conductor spaced apart by a separation distance; and wherein,
   the ratio of the width of each of the first and second split-bridge resistor tap conductors and the width of the first channel conductor are selected, in conjunction with the ratio of the first channel conductor width to the separation distance, to reduce measurement error below a selected value.

7. The apparatus of claim 1 wherein:
   the first and second split-bridge resistor voltage contact pads are each electrically connected to the split-bridge resistor by, respectively, a first and a second split-bridge resistor tap conductor having a width, a length, and a centerline axis wherein the length is at least twice the width.

8. The apparatus of claim 7 wherein:
the centerline axis of the first split-bridge resistor tap conductor is spaced apart from the junction of the first split conductor channel and bridge resistor and the centerline axis of the second split-bridge resistor tap conductor is spaced apart from the terminal end at the point where the first and second split conductor channels are rejoined by the end member, by at least a distance equal to twice the width of the first split conductor channel.

9. A testing apparatus for testing the accuracy of fabrication of circuit components on an integrated circuit comprising:
a first conductor and a second conductor each of equivalent width and formed into a cross during the fabrication process of the chip, along with the circuit components for the integrated circuit, with the second conductor having a first end and second end, and with the first conductor forming two extending cross arms, on either side of the second conductor at generally the first end of the second conductor, and a split-bridge portion contained in the second conductor at generally the second end of the second conductor and spaced apart from but electrically connected to the cross-arms by a bridge resistor portion of the second conductor, the split-bridge portion having first and second conductor channels separated by a space extending between the conductor channels;
a cross-arm voltage contact electrically connected to the extremity of one cross-arm;
a cross-arm current contact electrically connected to the extremity of the other cross-arm;
a first end current contact electrically connected at the first end of the second conductor;
a cross/bridge voltage contact electrically connected to the second conductor spaced equally apart from the center of the cross formed by the first and second conductors as the first end current contact is spaced from the center;
a bridge resistor voltage contact electrically connected to the bridge resistor portion;
a first and a second split-bridge voltage contact each electrically connected to the first spaced-apart conductor channel; and
a second end current contact electrically connected at the second end of the second conductor.

10. A method of electrically measuring the sheet resistance, line width, line spacing, and line pitch of an integrated circuit comprising the steps of:
electrically measuring the sheet resistance with a van der Pauw cross resistor structure;
employing the sheet resistance, electrically measuring the width of a bridge resistor having a width $2W+S$, electrically measuring the width of a split-bridge resistor having a width $2W$; and,
determining the line spacing from the difference of the width measurements of the bridge resistor and the split-bridge resistor, determining the line width by halving the width value obtained for the split-bridge resistor, and determining the line pitch by subtracting half the width value obtained from the split-bridge resistor from the width value obtained from the bridge resistor; and
validating the correctness of the measurements by confirming that the measured line pitch matches the designed layout rule line pitch, within acceptable tolerance.

* * * * *